(12) United States Patent
Kimura

(10) Patent No.: US 8,310,431 B2
(45) Date of Patent: Nov. 13, 2012

(54) IMAGE DISPLAY APPARATUS AND FREQUENCY ADJUSTMENT METHOD THEREOF

(75) Inventor: Tatsuo Kimura, Tokyo (JP)

(73) Assignee: NEC Display Solutions, Ltd., Tokyo (JP)

( * ) Notice: Subject to any disclaimer, the term of this patent is extended or adjusted under 35 U.S.C. 154(b) by 946 days.

(21) Appl. No.: 12/308,420

(22) PCT Filed: Feb. 8, 2008

(86) PCT No.: PCT/JP2008/052600
§ 371 (c)(1),
(2), (4) Date: Feb. 12, 2009

(87) PCT Pub. No.: WO2008/099948
PCT Pub. Date: Aug. 21, 2008

(65) Prior Publication Data
US 2010/0238349 A1    Sep. 23, 2010

(30) Foreign Application Priority Data

Feb. 8, 2007    (JP) ................................. 2007-029212

(51) Int. Cl.
*G09G 3/36*    (2006.01)
(52) U.S. Cl. ...................................................... 345/100
(58) Field of Classification Search .................. None
See application file for complete search history.

(56) References Cited

U.S. PATENT DOCUMENTS

| | | | | |
|---|---|---|---|---|
| 3,909,839 | A * | 9/1975 | Inaba et al. | 348/498 |
| 4,827,341 | A * | 5/1989 | Akimoto et al. | 348/526 |
| 4,980,765 | A * | 12/1990 | Kudo et al. | 348/716 |
| 5,070,395 | A * | 12/1991 | Kitaura et al. | 348/445 |
| 5,309,233 | A * | 5/1994 | Nishikawa et al. | 348/441 |

(Continued)

FOREIGN PATENT DOCUMENTS

EP    0 854 466 A1    7/1998

(Continued)

OTHER PUBLICATIONS

Japanese Office Action dated Aug. 31, 2011, with partial English translation.

(Continued)

*Primary Examiner* — Peter Vincent Agustin
(74) *Attorney, Agent, or Firm* — McGinn IP Law Group, PLLC

(57) ABSTRACT

A format of an inputted video signal is estimated to be based on the total number of vertical lines, and a frequency dividing ratio of a PLL unit is provisionally set at a predetermined value corresponding to the estimated format. Next, the frequency dividing ratio is calculated so that a measured value of a horizontal display width that is measured by a video detecting unit matches a capture width which is the horizontal display width capturable by a frame memory, and the calculated frequency dividing ratio is converted to a multiple of 4. A phase adjustment of the regenerative dot clock is performed against the video signal based on the converted frequency dividing ratio by using the regenerative dot clock generated by the PLL unit. Furthermore, the frequency dividing ratio is recalculated so that the measured value of the horizontal display width that is measured by the video detecting unit matches the capture width by using the regenerative dot clock after finishing the phase adjustment, and the calculated frequency dividing ratio is reset to the PLL unit.

10 Claims, 4 Drawing Sheets

U.S. PATENT DOCUMENTS

| | | | |
|---|---|---|---|
| 5,402,148 A * | 3/1995 | Post et al. | 345/698 |
| 5,767,916 A | 6/1998 | West | |
| 5,812,703 A * | 9/1998 | Juen et al. | 382/274 |
| 5,940,136 A | 8/1999 | Abe et al. | |
| 5,999,226 A * | 12/1999 | Choi | 348/564 |
| 6,043,803 A * | 3/2000 | Shimizu | 345/581 |
| 6,333,751 B1 | 12/2001 | Torii et al. | |
| 6,384,867 B1 | 5/2002 | Seino et al. | |
| 6,504,533 B1 * | 1/2003 | Murayama et al. | 345/204 |
| 6,515,708 B1 | 2/2003 | Kato | |
| 6,924,796 B1 | 8/2005 | Someya et al. | |
| 2006/0017847 A1 | 1/2006 | Tardif | |
| 2008/0002058 A1 | 1/2008 | Kawana et al. | |
| 2008/0074544 A1 | 3/2008 | Cappaert et al. | |
| 2010/0238349 A1 * | 9/2010 | Kimura | 348/540 |

FOREIGN PATENT DOCUMENTS

| | | |
|---|---|---|
| EP | 1 001 616 A2 | 5/2000 |
| EP | 1 047 043 A2 | 10/2000 |
| EP | 1 056 285 A2 | 11/2000 |
| EP | 1 615 423 A1 | 1/2006 |
| EP | 1 619 878 A2 | 1/2006 |
| JP | 7-306672 A | 11/1995 |
| JP | 10-91127 A | 4/1998 |
| JP | 10-135826 | 5/1998 |
| JP | 10-333627 | 12/1998 |
| JP | 11-175033 | 7/1999 |
| JP | 2000-276092 A | 10/2000 |
| JP | 2000-305555 A | 11/2000 |
| JP | 2001-166766 A | 6/2001 |
| JP | 3487119 | 10/2003 |
| JP | 2008-9259 | 1/2008 |

OTHER PUBLICATIONS

Japanese Office Action dated Mar. 23, 2011, with partial English translation.

Chinese Office Action dated Dec. 31, 2010, with English translation.

\* cited by examiner

IMAGE DISPLAY APPARATUS AND FREQUENCY ADJUSTMENT METHOD THEREOF

TECHNICAL FIELD

The present invention relates to an image display apparatus connected to a video signal source for outputting a video signal and a frequency adjustment method thereof.

BACKGROUND ART

As for an image display apparatus for displaying an image by means of a video signal, a liquid crystal panel including pixels placed like a lattice and the like are known. The kind of image display apparatus is connected to a video signal source such as a personal computer (hereinafter, abbreviated as a PC) or a workstation server so that it can display an image based on a video signal supplied from the video signal source.

The image display apparatus is supplied with a video signal which has a higher frequency than a horizontal synchronizing signal indicating a horizontal display period of a display image and which changes a signal level in synchronization with a clock including a certain frequency (hereinafter, referred to as a dot clock). The image display apparatus regenerates the dot clock that has the same frequency as the dot clock used by the video signal source, and displays the image based on the video signal supplied from the video signal source by using the regenerative dot clock. In this specification, the dot clock regenerated by the image display apparatus is called a regenerative dot clock. The image display apparatus includes a PLL (Phase Locked Loop) circuit, changes the frequency dividing ratio of a frequency divider provided to the PLL circuit and thereby adjusts the frequency of the regenerative dot clock so as to be an integral multiple of the horizontal synchronizing signal of the video signal supplied from the video signal source.

In the case where the frequency (or frequency dividing ratio) of the dot clock used by the video signal source is known, it is possible, by accordingly setting the frequency dividing, ratio of the PLL circuit, to correctly match the frequency of the regenerative dot clock with the dot dock used by the video signal source.

In the case where an inputted video signal, is an analog signal, however, there is no information on the dot clock supplied from the video signal source to the image display apparatus, and the horizontal synchronizing signal and a vertical synchronizing signal are supplied as timing information. In this case, the image display apparatus cannot obtain the information on a dot clock frequency (or frequency dividing ratio) used by the video signal source in advance. Therefore, there is no guarantee that the frequency dividing ratio of the PLL circuit can be correctly set. Unless the frequency dividing ratio is correctly set, the frequency of the regenerative dot dock will not match the frequency of the dot clock used by the video signal source. Therefore, there arises a deviation between the regenerative dot clock for capturing the video signal and the video signal so that the image can no longer be correctly displayed.

It is also possible for a user of the image display apparatus to adjust the frequency of the regenerative dot clock while viewing the display image by using an adjustment function provided to the image display apparatus in advance. However, such manual frequency adjustment of the regenerative dot clock is very cumbersome for the user.

Thus, there are proposals of various techniques for automatically adjusting the frequency of the regenerative dot clock.

For instance, Japanese patent No. 3487119 describes a dot clock regenerating apparatus including an A/D converter for converting a video signal (analog) inputted from the video signal source to a digital signal, a PLL circuit for generating a sampling clock (regenerative dot clock) synchronized with the horizontal synchronizing signal of the video signal, frequency analyzing means for detecting a folded frequency component generated when performing A/D conversion with a regenerative dot clock including a different frequency than the dot clock used by the video signal source, and a frequency dividing ratio setting circuit for adjusting the frequency dividing ratio of the PLL circuit according to the folded frequency component detected by the frequency analyzing means.

The dot clock regenerating apparatus matches the dot clock used by the video signal source with the regenerative dot clock by automatically adjusting the frequency of the regenerative dot clock to minimize the folded frequency component. Therefore, manual frequency adjustment is not necessary.

As for another method of automatically adjusting the frequency of the regenerative dot clock, the technique disclosed in U.S. Pat. No. 5,767,916 is known.

The technique described in U.S. Pat. No. 5,767,916 first measures the frequency of the horizontal synchronizing signal supplied together with an analog video signal (RGB) and counts the number of lines per frame. Subsequently, it estimates horizontal resolution of the analog video signal and the frequency of the dot clock with reference to a table created in advance based on the frequency and the number of lines of the horizontal synchronizing signal so as to provisionally set a horizontal display width E of the analog video signal and a frequency dividing ratio n. Next; it acquires a horizontal display width W of an actually captured video signal. Here, if W<E or W>E, a new frequency dividing ratio n' is acquired by [n'=n×E/W], and the same adjustment is made in the next frame. If W=E, it determines that the frequency of the regenerative dot clock has been correctly adjusted, and finishes the automatic adjustment.

In recent years, there are a variety of video signals, and the video signals in various formats are inputted to the image display apparatus. As for the video signals representing those, there are XGA (eXtended Graphics Array), SXGA (Super XGA) and the like which are the VESA (Video Electronics Standards Association) standards. As demand for wide size screens has grown due to spread of a digital high definition image products, there is also a signal in a WXGA (Wide XGA: 1280×768) format that extends the horizontal width of the XGA.

As mentioned above, the image display apparatus is supplied with the horizontal synchronizing signal and the vertical synchronizing signal other than the video signal. Therefore, it is difficult to correctly determine the format of the inputted video signal just by using such synchronizing signal information.

The image display apparatus includes a frame memory for storing the video signals per screen. However, memory capacity of the frame memory is limited due to costs and the like. Therefore, there are the cases where there is a difference between the number of horizontal video data capturable by the frame memory (hereinafter, referred to as capture width) and the horizontal display width which is the number of horizontal video data as a display subject.

In the case where the horizontal display width is larger than the capture width of the frame memory, the horizontal display width is normally matched with the capture width of the frame memory by reducing the number of analog signals that are sampled when using an A/D converter to convert the analog video signal. In the case where the horizontal display width is smaller than the capture width of the frame memory, the horizontal display width is matched with the capture width of the frame memory by increasing the number of analog signals that are sampled when using an A/D converter to convert the analog video signal. As A/D conversion is performed by using the regenerative dot clock generated from the horizontal synchronizing signal, it is necessary to adjust the frequency of the regenerative dot clock so that the horizontal display width matches the capture width of the frame memory.

Furthermore, in conjunction with higher resolution of the video signal in recent years, there are the cases where the frequency of the regenerative dot clock exceeds the maximum operating frequency operable in the A/D converter and in the video processing unit for executing a process for displaying the video signal on a display or the like. In this case, it is necessary to make an adjustment so that the frequency of the regenerative dot clock does not exceed the maximum operating frequency by reducing the capture width of the video data of the frame memory.

As mentioned above, however, it is difficult to correctly determine the format of the video signal. And there is no guarantee that the frequency dividing ratio of the PLL circuit for generating the regenerative dot clock can be correctly set according to the format of the video signal and the capture width of the frame memory. For that reason, the frequency of the regenerative dot clock for capturing the video signal deviates from the frequency of the video signal so that the image can no longer be correctly displayed.

DISCLOSURE

Thus, an exemplary object of the invention is to provide an image display apparatus capable of generating a regenerative dot clock including an optimal frequency based on the format of a video signal and correctly displaying an image and a frequency adjustment method thereof.

To attain the object, the exemplary aspect of the invention provides an image display apparatus including:

a PLL unit for multiplying a horizontal synchronizing signal and generating a regenerative dot dock for displaying an inputted video signal;

a synchronization detecting unit for detecting the total number of vertical lines which is the total number of lines per frame of the video signal from the horizontal synchronizing signal and from a vertical synchronizing signal;

a video detecting unit for measuring a horizontal display width which is the number of horizontal video signal data as a display subject included in the video signal by using the regenerative dot clock generated by the PLL unit;

a frame memory for holding the video signals in units of frames; and a CPU unit for estimating a format of the inputted video signal based on the total number of vertical lines, provisionally setting a frequency dividing ratio of the PLL unit at a predetermined value corresponding to the estimated format, calculating the frequency dividing ratio so that a measured value of a horizontal display width measured by the video detecting unit matches a capture width which is the horizontal display width capturable by the frame memory, converting the calculated frequency dividing ratio to a multiple of 4, performing a phase adjustment of the regenerative dot clock against the video signal based on the converted frequency dividing ratio by using the regenerative dot clock generated by the PLL unit, recalculating the frequency dividing ratio so that the measured value of the horizontal display width measured by the video detecting unit matches the capture width by using the regenerative dot clock after finishing the phase adjustment; and resetting the calculated frequency dividing ratio to the PLL unit.

The exemplary aspect of the invention provides a frequency adjustment method for adjusting a frequency of a regenerative dot clock correspondingly to a video signal with an image display apparatus including:

a PLL unit for multiplying a horizontal synchronizing signal and generating a regenerative dot clock for displaying an inputted video signal;

a synchronization detecting unit for detecting the total number of vertical lines which is the total number of lines per frame of the video signal from the horizontal synchronizing signal and from a vertical synchronizing signal;

a video detecting unit for measuring a horizontal display width which is the number of horizontal video signal data as a display subject included in the video signal by using the regenerative dot dock generated by the PLL unit; and a frame memory for holding the video signals in units of frames, wherein it is the method of:

estimating a format of the inputted video signal based on the total number of vertical lines;

provisionally setting a frequency dividing ratio of the PLL unit at a predetermined value corresponding to the estimated format;

calculating the frequency dividing ratio so that a measured value of a horizontal display width measured by the video detecting unit matches a capture width which is the horizontal display width capturable by the frame memory and converting the calculated frequency dividing ratio to a multiple of 4;

performing a phase adjustment of regenerative dot clock against the video signal based on the converted frequency dividing ratio by using the regenerative dot clock generated by the PLL unit;

recalculating the frequency dividing ratio so that the measured value of the horizontal display width measured by the video detecting unit matches the capture width by using the regenerative dot clock after finishing the phase adjustment; and resetting the calculated frequency dividing ratio to the PLL unit.

EXEMPLARY EMBODIMENT

Next, the exemplary embodiment will be described with reference to the drawings.

Figure 1:
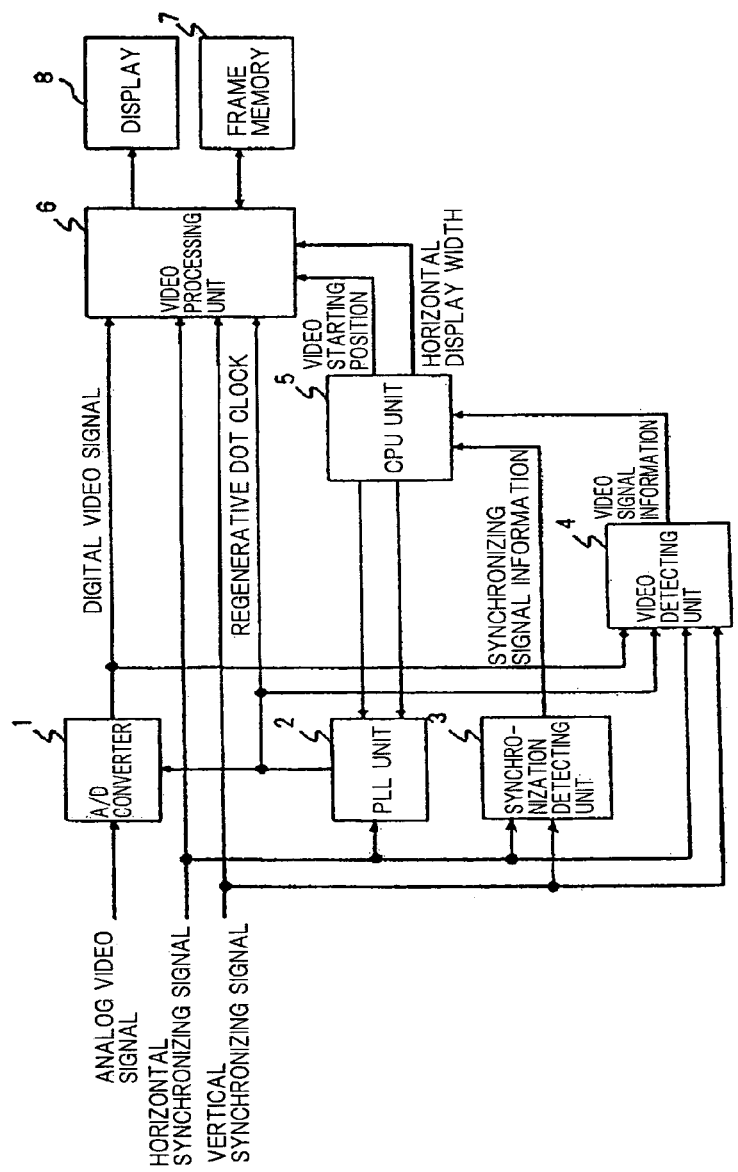
FIG. 1 is a block diagram showing a configuration example of an image display apparatus of the exemplary embodiment.
Figure 2:
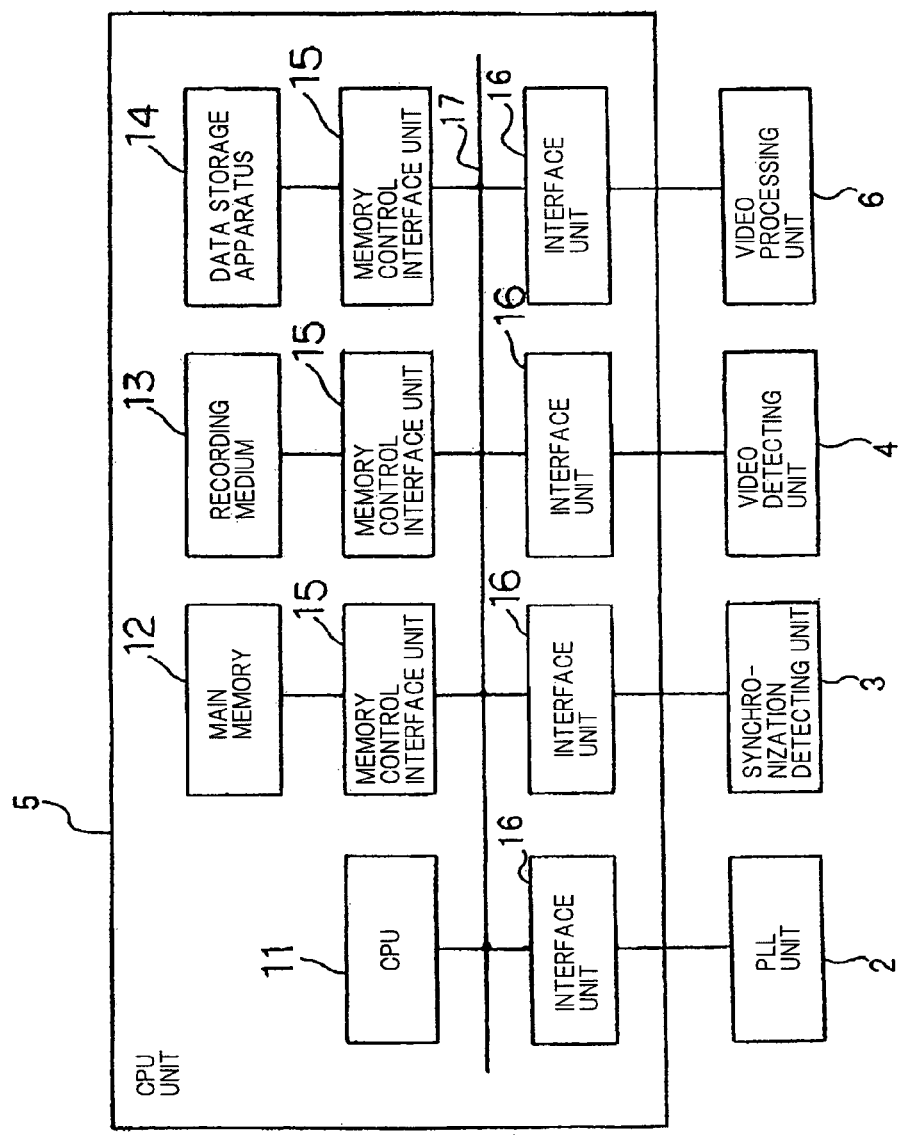
FIG. 2 is a block diagram showing a configuration example of a CPU unit shown in FIG. 1.
Figure 3:
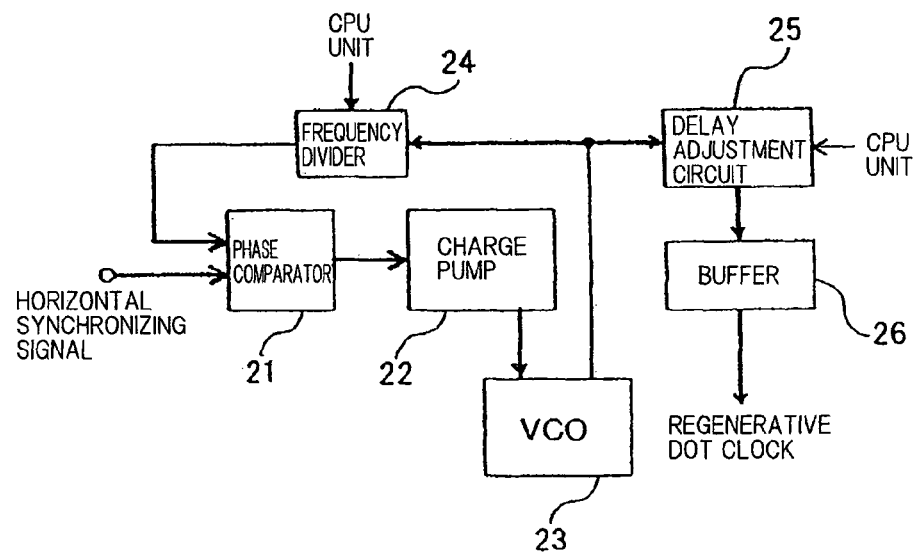
FIG. 3 is a block diagram showing a configuration example of a PLL unit shown in FIG. 1.

FIG. 1 is a block diagram showing a configuration example of an image display apparatus of the exemplary embodiment, and FIG. 2 is a block diagram showing a configuration example of a CPU unit shown in FIG. 1. FIG. 3 is a block diagram showing a configuration example of a PLL unit shown in FIG. 1. In the case where a video signal inputted from a PC or the like is a composite signal or a sync-on-green signal, the image display apparatus shown in FIG. 1 has the video signal inputted thereto after being separated into an analog video signal and synchronizing signals (a horizontal synchronizing signal and a vertical synchronizing signal) by a synchronizing Separation unit not shown.

As shown in FIG. 1, the image display apparatus includes A/D converter 1 for converting an analog video signal to a digital video signal by using a regenerative dot clock, PLL unit 2 for multiplying a horizontal synchronizing signal and generating a regenerative dot clock and which is capable of a phase adjustment of the regenerative dot clock against the analog video signal, synchronization detecting unit 3 for detecting synchronizing signal information such as a horizontal synchronizing frequency, vertical synchronizing frequency and the total number of vertical lines from the horizontal synchronizing signal and the vertical synchronizing signal, video detecting unit 4 for detecting a display signal to be actually displayed from the digital video signal and outputting horizontal and vertical video starting positions and values such as a horizontal display width as video signal information, frame memory 7 for holding the digital video signals in units of frames, display 8 for displaying an image according to the digital video signal readout from frame memory 7, video processing unit 6 for reading the digital video signal from frame memory 7 and executing a process for displaying video-based on the read video signal on display 8, and CPU unit 5 for obtaining the information detected by synchronization detecting unit 3 and video detecting unit 4 and performing required arithmetic processing. The total number of vertical lines refers to the total number of lines existing between the vertical synchronizing signals which are pulse signals.

As shown in FIG. 2, CPU unit 5 is a processor (computer) including CPU 11 for executing a process according to a program. CPU unit 5 includes CPU 11, main memory 12 for temporarily storing information necessary to the process of CPU 11, recording medium 13 in which the program for causing CPU 11 to execute the required process is recorded, data storage apparatus 14 in which preset temporary set value n of a frequency dividing ratio and phase adjustment value of PLL unit 2 corresponding to a format of an input signal are stored, memory control interface unit 15 for controlling data transfer with main memory 12, recording medium 13 and data storage apparatus 14, and interface unit 16 for transmitting and receiving information to and from PLL unit 2, synchronization detecting unit 3, video detecting unit 4 and video processing unit 6. CPU 11, memory control interface unit 15 and interface unit 16 are connected via bus 17.

CPU unit 5 realizes a function as CPU unit 5 described below by executing the process with CPU 11 according to the program stored in recording medium 13. Recording medium 13 may be a magnetic disk, a semiconductor memory, an optical disk or another recording medium.

As shown in FIG. 3, PLL unit 2 includes phase comparator 21, charge pump 22, VCO (Voltage Controlled Oscillator) 23, frequency divider 24, delay adjustment circuit 25 and buffer 26.

Phase comparator 21 compares the phases of the horizontal synchronizing signal and an output signal of frequency divider 24, and outputs a phase difference signal thereof. Charge pump 22 supplies VCO 23 with a direct-current voltage proportional to the phase difference signal outputted from phase comparator 21. VCO 23 oscillates a signal of a predetermined frequency according to the direct-current voltage outputted from charge pump 22. Frequency divider 24 frequency-divides the output signal of VCO 23 and returns it to phase comparator 21. PLL unit 2 of such a configuration outputs from VCO 23 a frequency signal wherein the horizontal synchronizing signal inputted to phase comparator 21 is multiplied at the frequency dividing ratio set by frequency divider 24. The output signal of VCO 23 is delayed by delay adjustment circuit 25 based on the phase adjustment value set up from CPU unit 5, and is outputted as the regenerative dot clock via buffer 26.

Synchronization detecting unit 3, video detecting unit 4 and video processing unit 6 can be realized by an integrated circuit apparatus including a memory and a logic circuit or an integrated circuit apparatus provided with a DSP, a CPU and the like for executing the process according to the program.

The image display apparatus of the exemplary embodiment estimates the format of an inputted analog video signal based on the total number of vertical lines of the inputted signal through the process of CPU unit 5. And it provisionally sets the frequency dividing ratio and the phase adjustment value of PLL unit 2 corresponding to the estimated format at predetermined values (provisional setting). Video detecting unit 4 measures the horizontal display width by using the regenerative dot clock generated by PLL unit 2 based on the frequency dividing ratio after the provisional setting. In this case, the frequency dividing ratio and the phase adjustment value of PLL unit 2 are not accurate, and so the measured value does not always become a correct horizontal display width. Therefore, CPU unit 5 makes a correction by calculating the frequency dividing ratio of PLL unit 2 so that the measured value of the horizontal display width matches the capture width. CPU unit 5 converts the frequency dividing ratio of PLL unit 2 calculated in this case to a multiple of 4. This is because, since the total number of horizontal dots of the video signals of most standards are multiples of 4, it is considered that a multiple of 4 is a correct value of the frequency dividing ratio of PLL unit 2 for generating the regenerative dot clock from the horizontal synchronizing signal. The total number of horizontal dots refers to the total number of pixel data existing between the horizontal synchronizing signals which are pulse signals.

If the setting of the frequency dividing ratio of PLL unit 2 is finished, the phase adjustment of the regenerative dot clock is performed against the analog video signal by using the regenerative dot clock generated by PLL unit 2 based on the frequency dividing ratio converted to a multiple of 4.

As mentioned above, frame memory 7 included in the image display apparatus has limited storage capacity due to costs and the like. For that reason, the horizontal display width capturable by frame memory 7 (capture width) may be different from the horizontal display width of an actual video signal. In the case where the horizontal display width of the video signal is larger than the capture width of frame memory 7, as mentioned above, the horizontal display width of the video signal matches the capture width of the frame memory by reducing the number of analog signals that are sampled when using an A/D converter to convert the analog video signal. In the case where the horizontal display width of the video signal is smaller than the capture width of frame memory 7, as mentioned above, the horizontal display width of the video signal matches the capture width of the frame memory by increasing the number of analog signals that are sampled when using an A/D converter to convert the analog video signal. In this case, there is a possibility that, if the frequency dividing ratio of PLL unit 2 is converted to a multiple of 4, the measured value of the horizontal display width does not match the horizontal display width capturable by frame memory 7 (capture width).

As mentioned above, there are cases where the regenerative dot clock exceeds the maximum operating frequency of A/D converter 1 and video processing unit 6. In this case, an adjustment is made by reducing the capture width of frame memory 7 so that the regenerative dot clock does not exceed the maximum operating frequency. For that reason, there arises a difference between the horizontal display width of the actual video signal and the capture width of frame memory 7. Because of the above hardware constraints, the frequency dividing ratio of PLL unit 2 cannot be simply set at a multiple of 4.

Thus, the image display apparatus of the exemplary embodiment measures the horizontal display width again by using the regenerative dot clock after finishing the phase adjustment of the regenerative dot clock, and recalculates the frequency dividing ratio of PLL unit 2 so that the measured value thereof matches the capture width. At this stage, the reset frequency dividing ratio is not converted to a multiple of 4. The process is finished by resetting the calculated, frequency dividing ratio to PLL unit 2.

According to the exemplary embodiment, it is possible to obtain a more optimal frequency dividing ratio of PLL unit 2 according to the format of the video signal by converting the frequency dividing ratio of PLL unit 2, calculated by using the measured value of the horizontal display width, to a multiple of 4.

After finishing the phase adjustment of the regenerative dot clock, the frequency dividing ratio is reset by using the measured value of the horizontal display width. Thus, the frequency dividing ratio is corrected to a correct value even if the capture width of frame memory 7 becomes different from the horizontal display width of the actual video signal due to the limited storage capacity of frame memory 7 and the like, and an error is generated by converting the frequency dividing ratio of PLL unit 2 to a multiple of 4.

Therefore, it is possible to obtain the regenerative dot clock of the optimal frequency according to the format of the video signal and to accurately capture all the video signals in a display area in frame memory 7. Therefore, the image can be correctly displayed.

Next, the procedure of the image display apparatus of the exemplary embodiment will be described by using the drawings.

Figure 4:
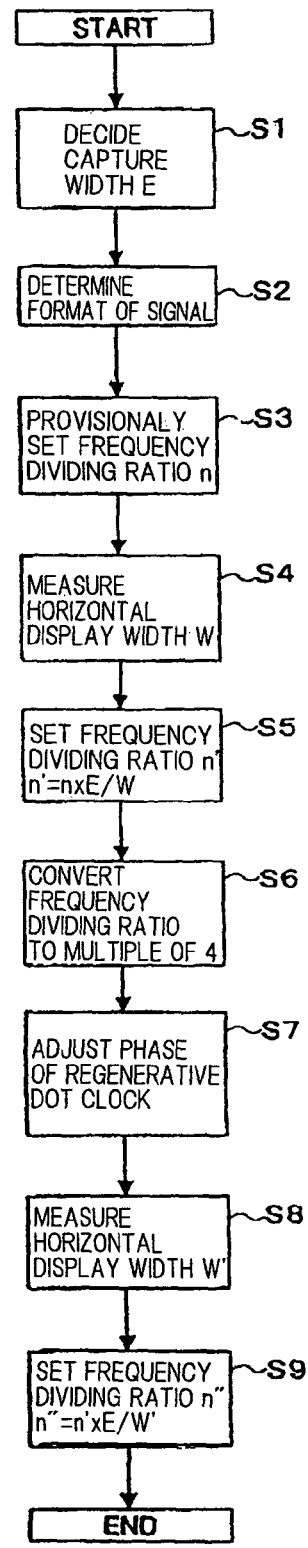
FIG. 4 is a flowchart showing a procedure of the image display apparatus shown in FIG. 1.

FIG. 4 is a flowchart showing the procedure of the image display apparatus shown in FIG. 1.

As shown in FIG. 4, CPU unit 5 first decides horizontal capture width E of the digital video signal that is capturable by frame memory 7 according to the storage capacity of frame memory 7 (step S1). Capture width E is set at 1024 corresponding to XGA, for instance, to suit the resolution of display 8. Capture width E is not limited to 1024. It can be set at 1280 corresponding to SXGA or to a larger value, for instance, in the case where frame memory 7 has a larger storage capacity. In that case, however, it is necessary that the resolution of display 8 be also able to meet SXGA and a larger value.

Next, CPU unit 5 obtains the synchronizing signal information such as the horizontal synchronizing frequency, the vertical synchronizing frequency and the total number of vertical lines detected by synchronization detecting unit 3. And CPU unit 5 determines the format of the input signal (analog video signal) based on the value of the total number of vertical lines (step S2). For instance, in the case where the vertical synchronizing frequency is 60,004 Hz (period 16.666 ms) and the horizontal synchronizing frequency is 48,363 KHz (period 20.677 μs), the total number of vertical lines is 806 (=16.666/20.677×1000). Therefore, it is determined that the format of the input signal is XGA.

As for the XGA, SXGA and the like, the total number of horizontal dots and the total number of vertical lines are decided by VESA standards. In the case of XGA, the total number of horizontal dots is 1344 and the total number of vertical lines is 806. XGA has a video signal of 1024×768 accommodated in the frame configured by 1344×806.

Subsequently, CPU unit 5 provisionally sets frequency dividing ratio n and the phase adjustment value which are predetermined to PLL unit 2 according to the format of the input signal determined in the process of step S2 (step S3). As for temporary set value n of the frequency dividing ratio and the phase adjustment value, the values corresponding to the format of the input signal may be read out with reference to a table created in advance and stored in data storage apparatus 14 shown in FIG. 2. For instance, in the case where the format of the input signal is XGA, the total number of horizontal dots is 1344 so that temporary set value n of the frequency dividing ratio may also be set at 1344.

Next, CPU unit 5 obtains measured value W of the horizontal display width from the video signal information detected by video detecting unit 4 (step S4). Video detecting unit 4 has a predetermined threshold and determines the digital video signal whose level is larger than the threshold as a display subject signal so as to measure the measured value W of the horizontal display width by using the horizontal synchronizing signal; the horizontal video starting position and video ending position and the regenerative dot clock. Here, as there is a high possibility that the phase adjustment value provisionally set to PLL unit 2 is not an accurate value, there are many cases where the measured value W of the horizontal display width does not match a desired horizontal display width (capture width E).

CPU unit 5 calculates the frequency dividing ratio of PLL unit 2 in order to adjust the frequency of the regenerative dot clock so that the measured value W of the horizontal display width and capture width E become equal (step S5).

In this case, set value n' of the frequency dividing ratio is acquired as follows:

$$n' = n \times E/W$$

Furthermore, according to the exemplary embodiment, the calculated n' is converted to a multiple of 4 (step S6).

For instance, in the case where the measured value W of the horizontal display width acquired in the process of step S4 is 1025, it becomes as follows:

$$n' = 1344 \times 1024/1025 = 1342 \text{(fractional portion dropped)}.$$

Furthermore, the following is acquired, and n' is converted to a multiple of 4:

$$n' = \text{INT}((1342+2)/4) \times 4 = 1344$$

Here, INT indicates a calculation for extracting an integer by dropping the fractional portion of a calculation result. The calculation is equal to the process of performing "dropping 1 and rounding up 2" to the value of the nearest multiple of 4 with respect to the value before conversion.

If the frequency dividing ratio of PLL unit 2 is decided, CPU unit 5 adjusts the phase of the regenerative dot clock generated based on the frequency dividing ratio (step S7). CPU unit 5 sequentially changes the phase adjustment value of PLL unit 2, and reads out the video signal information on each individual phase adjustment value from video detecting unit 4. And CPU unit 5 analyzes the video signal information and derives an optimal phase adjustment value so as to set it to PLL unit 2. A phase adjustment method of the regenerative dot clock, for example, is described in detail in Japanese patent application No. 2006-181437. This application was filed earlier by the applicant hereof.

Next, as with the process in step S4, CPU unit 5 obtains the measured value W' of the horizontal display width that is measured by using the regenerative dot clock after the phase adjustment from the video signal information detected by video detecting unit 4 (step S8). Since the phase adjustment of the regenerative dot clock is finished here, there is no deviation of the measured value of the horizontal display width which is caused by phase shifting of the regenerative dot clock. As mentioned above, however, in the case where the horizontal display width of the video signal is different from the capture width of frame memory 7, the measured value W' of the horizontal display width may not match the desired horizontal display width (capture width E) since the frequency dividing ratio has been converted to a multiple of 4 in the process of step S6.

CPU unit 5 recalculates the frequency dividing ratio of PLL unit 2 so that the measured value W of the horizontal display width and capture width E become equal (step S9).

In this case, reset value n" of the frequency dividing ratio is acquired as follows:

$$n''=n'\times E/W'$$

Here, calculated n" is set to frequency divider 24 of PLL unit 2 without converting it to a multiple of 4, and the process is finished.

If the frequency dividing ratio of PLL unit 2 is reset in the process of step S9, it is generally considered that the phase of the regenerative dot clock needs to be adjusted again as in the process of step S7. However, a phase adjustment process derives the optimal phase adjustment value by using the video signal information of several to several dozen frames. Therefore, it takes a very long processing time compared with other processes. For that reason, it is desirable that the number of times of the phase adjustment process be required to be a minimum.

The difference in the frequency dividing ratio set up in the above-mentioned processes of step. S6 and step S9 is within 4, and so the frequency of the regenerative dot clock changes a little. For that reason, the phase of the regenerative dot clock hardly changes even if the frequency dividing ratio of PLL unit 2 is changed after the phase adjustment. Therefore, the display video is hardly influenced even if the phase adjustment of the regenerative dot clock is not implemented again after the process of step S9.

Thus, according to the exemplary embodiment, the phase adjustment of the regenerative dot clock is not implemented again even if the frequency dividing ratio of PLL unit 2 is changed after the phase adjustment. In that case, the phase adjustment process is performed just once so that the entire processing time required for a frequency adjustment and the phase adjustment of the regenerative dot clock is not long.

In the case where it is not especially problematic that the processing time becomes long, the phase adjustment of the regenerative dot clock may be implemented again after resetting the frequency dividing ratio of PLL unit 2 in the process of step S9. In that case, the phase of the regenerative dot clock matches the video signal more accurately so that degradation of the display image due to phase shifting is reduced.

Next, examples of the image display apparatus of the exemplary embodiment will be described.

First Example

A first example is an example wherein an analog video signal of 1024×768 (60 Hz) corresponding to XGA is inputted to the image display apparatus. In this case, the vertical synchronizing frequency of the input signal is 60,004 Hz (period 16.666 ms), the horizontal synchronizing frequency is 48,363 KHz (period 20.677 μs), the total number of vertical lines is 806 (=16.666/20.677×1000), and the total number of horizontal dots is 1344. Capture width E is 1024 due to the limitation of the storage capacity of frame memory 7.

CPU unit 5 determines the input signal as XGA based on the total number of vertical lines (=806) in step S2, and provisionally sets the frequency dividing ratio of PLL unit 2 at 1344 in step S3.

Next, in step S4, CPU unit 5 obtains measured value W of the horizontal display width that is measured by using the regenerative dot clock generated after the process of step S3 from video detecting unit 4. Here, W=1025 is obtained. In this case, since the measured value W of the horizontal display width is larger than capture width E (1024) of frame memory 7, there is a possibility that all the video signals as display subjects cannot be captured by frame memory 7 and a part of the display video may get chipped. CPU unit 5 sets the frequency dividing ratio of PLL unit 2 in step S5 so that measured value W of the horizontal display width and capture width E become equal.

In this case, set value n' of the frequency dividing ratio is as follows:

$$n'=1344\times1024/1025=1342 \text{(fractional portion dropped)}$$

Furthermore, the following is acquired in step S6, and n' is converted to a multiple of 4.

$$n'=\text{INT}((1342+2)/4)\times4=1344$$

Next, CPU unit 5 adjusts the phase of the regenerative dot clock in step S7.

After phase adjustment of the regenerative dot clock, CPU unit 5 obtains measured value W of the horizontal display width that is measured by using the regenerative dot clock generated after the process of step S7 again from video detecting unit 4 in step S8. Here, phase adjustment of the regenerative dot clock is finished, and the reset value of frequency dividing ratio n' is converted to a multiple of 4 so that measured value W'=1024 is obtained.

Lastly, in step S9, CPU unit 5 resets the frequency dividing ratio of PLL unit 2 so that the measured value W of the horizontal display width and capture width E become equal.

In this case, reset value n" of the frequency dividing ratio is as follows:

$$n''=1344\times1024/1024=1344$$

Second Example

A second example is an example wherein a video signal of 1280×768 (60 Hz) is inputted to the image display apparatus.

In this case, the vertical synchronizing frequency of the input signal is 59,833 Hz (period 16.713 ms), the horizontal synchronizing frequency is 47,986 KHz (period 20.839 μs), the total number of vertical lines is 802 (=16.713/20.839×1000), and the total number of horizontal dots is 1688. Horizontal display width E is 1024 due to the limitation of the storage capacity of frame memory 7.

CPU unit 5 determines the format of the video signal based on the total number of vertical lines (=802) in step S2. Here, the value of the total number of vertical lines is close to that of the input signal exemplified in the first example, and so it is difficult to distinguish this value from the input signal exemplified in the first example. For that reason, CPU unit 5 determines the format of the input signal to be 1024×768 (XGA) which is the same as in the first example, and provisionally sets the frequency dividing ratio of PLL unit 2 at 1344 in step S3.

According to this exemplary embodiment, the format of the video signal is 1280×768. Therefore, if capture width E capturable by frame memory 7 is 1024, all the video signals cannot be captured by frame memory 7. For that reason, the horizontal display width of the video signal is converted to 1024 by reducing the number of analog signals that are sampled when using an A/D converter to convert the analog video signal from 1280 to 1024.

In step S4, CPU unit 5 obtains the measured value W of the horizontal display width that is measured by using the regenerative dot clock generated after the process of step S3 from video detecting unit 4. Here, W=1019 is obtained.

CPU unit 5 sets the frequency dividing ratio of PLL unit 2 in step S5 so that the measured value W of the horizontal display width and capture width E become equal.

In this case, set value n' of the frequency dividing ratio is as follows:

$$n'=1344 \times 1024/1019=1350 \text{(fractional portion dropped)}$$

Furthermore, the following is acquired in step S6, and n' is converted to a multiple of 4:

$$n'=\text{INT}((1350+2)/4) \times 4=1352$$

Next, CPU unit 5 adjusts the phase of the regenerative dot clock in step S7.

After the phase adjustment of the regenerative dot clock, CPU unit 5 obtains the measured value W of the horizontal display width that is measured by using the regenerative dot clock generated after the process of step S7 again from video detecting unit 4 in step S8. Here, the phase adjustment of the regenerative dot clock is finished, and the reset value of the frequency dividing ratio n' is converted to a multiple of 4 so that the measured value W=1025 is obtained.

Lastly, in step S9, CPU unit 5 resets the frequency dividing ratio of PLL unit 2 so that the measured value W' of the horizontal display width and capture width E become equal.

In this case, reset value n" of the frequency dividing ratio is as follows:

$$n''=1352 \times 1024/1025=1350$$

Third Exemplary Embodiment

A third exemplary embodiment is an example wherein a video signal of 1280×1024 (60 Hz) corresponding to SXGA is inputted to the image display apparatus.

In this case, the vertical synchronizing frequency is 60,020 Hz (period 16.661 ms), the horizontal synchronizing frequency is 63,981 KHz (period 15.630 µs), the total number of vertical lines is 1066 (=16.661/15.630×1000), and the total number of horizontal dots is 1688. Horizontal display width E is 1024 due to the limitation of the storage capacity of frame memory 7.

CPU unit 5 determines the format of the video signal based on the total number of vertical lines (=1066) of the input signal in step S2. Here, it determines the input signal as SXGA, and provisionally sets 1350 to the frequency dividing ratio of PLL unit 2 in step S3.

According to this exemplary embodiment, the format of the video signal is 1280×1024. Therefore, if capture width E capturable by frame memory 7 is 1024, all the video signals cannot be captured by frame memory 7. For that reason, as with the second example, the horizontal display width of the video signal is converted to 1024 by reducing the number of analog signals that are sampled when using an Z/D converter to convert the analog video signal from 1280 to 1024. For that reason, the frequency dividing ratio of PLL unit 2 is 1350 above which is the value assumed in advance to match the horizontal display width with capture width E (1024).

In step S4, CPU unit 5 obtains the measured value W of the horizontal display width that is measured by using the regenerative dot clock generated after the process of step S3 from video detecting unit 4. Here, W=1023 is obtained.

CPU unit 5 resets the frequency dividing ratio of PLL unit 2 in step S5 so that measured value W of the horizontal display width and capture width E become equal.

In this case, reset value n' of the frequency dividing ratio is as follows:

$$n'=1350 \times 1024/1023=1351 \text{(fractional portion dropped)}$$

Furthermore, the following is acquired, and n' is converted to a multiple of 4 in step S6.

$$n'=\text{INT}((1351+2)/4) \times 4=1352$$

Next, CPU unit 5 adjusts the phase of the regenerative dot clock in step S7.

After the phase adjustment of the regenerative dot clock, CPU unit 5 obtains the measured value W' of the horizontal display width that is measured by using the regenerative dot clock that is generated after the process of step S7 again from video detecting unit 4 in step S8. Here, the phase adjustment of the regenerative dot clock is finished, and the reset value of the frequency dividing ratio n' is converted to a multiple of 4 so that the measured value W=1025 is obtained.

Lastly, in step S9, CPU unit 5 resets the frequency dividing ratio of PLL unit 2 so that the measured value W of the horizontal display width and capture width E become equal.

In this case, reset value n" of the frequency dividing ratio is as follows:

$$n''=1352 \times 1024/1025=1350$$

This application is based upon and claims the benefit of priority from Japanese patent application No. 2007-029212, filed on Feb. 8, 2007, the disclosure of which is incorporated herein in its entirety by reference.

The invention claimed is:

1. An image display apparatus, comprising:
   a Phase Locked Loop (PLL) unit for multiplying a horizontal synchronizing signal and generating a regenerative dot clock for displaying an inputted video signal;
   a synchronization detecting unit for detecting a total number of vertical lines which is a total number of lines per frame of the video signal from the horizontal synchronizing signal and from a vertical synchronizing signal;
   a video detecting unit for measuring a horizontal display width which is a number of horizontal video signal data as a display subject included in the video signal by using the regenerative dot clock generated by the PLL unit;
   a frame memory for holding the video signals in units of frames; and
   a Central Processing Unit (CPU) for estimating a format of the inputted video signal based on the total number of vertical lines, provisionally setting a frequency dividing ratio of the PLL unit at a predetermined value corresponding to the estimated format, calculating the frequency dividing ratio so that a measured value of the horizontal display width measured by the video detecting unit matches a capture width which is the horizontal display width capturable by the frame memory, converting the calculated frequency dividing ratio to a multiple of 4, performing a phase adjustment of the regenerative dot clock against the video signal based on the converted frequency dividing ratio by using the regenerative dot clock generated by the PLL unit, recalculating the frequency dividing ratio so that the measured value of the horizontal display width measured by the video detecting unit matches the capture width by using the regenerative dot clock after finishing the phase adjustment, and resetting the calculated frequency dividing ratio to the PLL unit.

2. The image display apparatus according to claim 1, wherein the CPU implements the phase adjustment of the regenerative dot clock against the video signal again after resetting the frequency dividing ratio.

3. The image display apparatus according to claim 1, wherein, in said recalculating the frequency dividing ratio, a reset frequency dividing ratio is converted to other than a multiple of 4.

4. The image display apparatus according to claim 1, wherein in said resetting the calculated frequency dividing ratio, the CPU resets the frequency dividing ratio by using the measured value of the horizontal display width.

5. The image display apparatus according to claim 1, wherein, in said recalculating the frequency dividing ratio, the measured value of the horizontal display width becomes equal to the capture width.

6. The image display apparatus according to claim 1, wherein a frequency of the regenerative dot clock equals a result of multiplying a frequency of the horizontal synchronizing signal by the frequency dividing ratio.

7. A frequency adjustment method for adjusting a frequency of a regenerative dot clock correspondingly to a video signal with an image display apparatus comprising:
 a Phase Locked Loop (PLL) unit for multiplying a horizontal synchronizing signal and generating a regenerative dot clock for displaying an inputted video signal; and
 a frame memory for holding the video signals in units of frames,
 wherein the method comprises:
  estimating a format of the inputted video signal based on a total number of vertical lines which is a total number of lines per frame of the video signal;
  provisionally setting a frequency dividing ratio of the PLL unit at a predetermined value corresponding to the estimated format;
  calculating the frequency dividing ratio so that a measured value of a horizontal display width which is a number of horizontal video signal data as a display subject matches a capture width which is the horizontal display width capturable by the frame memory and converting the calculated frequency dividing ratio to a multiple of 4;
  performing a phase adjustment of the regenerative dot clock against the video signal based on the converted frequency dividing ratio by using the regenerative dot clock generated by the PLL unit;
  recalculating the frequency dividing ratio so that the measured value of the horizontal display width matches the capture width by using the regenerative dot clock after finishing the phase adjustment; and
  resetting the calculated frequency dividing ratio to the PLL unit.

8. The frequency adjustment method according to claim 7, wherein the phase adjustment of the regenerative dot clock is implemented against the video signal again after resetting the frequency dividing ratio.

9. A non-transitory recording medium encoded with a computer program for causing a computer to adjust a frequency of a regenerative dot clock correspondingly to a video signal, the computer comprising:
 a Phase Locked Loop (PLL) unit for multiplying a horizontal synchronizing signal and generating the regenerative dot clock for displaying an inputted video signal; and
 a frame memory for holding the video signals in units of frames,
 wherein the program includes instructions for a method comprising:
  estimating a format of the inputted video signal based on a total number of vertical lines which is a total number of lines per frame of the video signal;
  provisionally setting a frequency dividing ratio of the PLL unit at a predetermined value corresponding to the estimated format;
  calculating the frequency dividing ratio so that a measured value of a horizontal display width which is a number of horizontal video signal data as a display subject matches a capture width which is the horizontal display width capturable by the frame memory and converting the calculated frequency dividing ratio to a multiple of 4;
  performing a phase adjustment of the regenerative dot clock against the video signal based on the converted frequency dividing ratio by using the regenerative dot clock generated by the PLL unit;
  recalculating the frequency dividing ratio so that the measured value of the horizontal display width matches the capture width by using the regenerative dot clock after finishing the phase adjustment; and
  resetting the calculated frequency dividing ratio to the PLL unit.

10. The non-transitory recording medium according to claim 9, the instructions causing the computer to execute a process of implementing the phase adjustment of the regenerative dot clock against the video signal again after resetting the frequency dividing ratio.

* * * * *